(12) United States Patent
Carlson

(10) Patent No.: US 6,326,819 B1
(45) Date of Patent: Dec. 4, 2001

(54) CURRENT BUFFER FOR GATE DRIVE

(75) Inventor: Douglas S. Carlson, Hawthorne, CA (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 09/439,449

(22) Filed: Nov. 15, 1999

(51) Int. Cl.$^7$ .................................. H03K 3/00; H03B 1/00
(52) U.S. Cl. ............................. 327/108; 327/112; 326/83
(58) Field of Search .................................... 327/108, 112, 327/333, 434; 326/82, 83, 86, 87

(56) References Cited

U.S. PATENT DOCUMENTS

| | | | | |
|---|---|---|---|---|
| 4,703,198 | * | 10/1987 | Porter et al. | 326/86 |
| 5,223,753 | * | 6/1993 | Lee et al. | 327/65 |
| 5,486,777 | * | 1/1996 | Nguyen | 326/68 |
| 5,698,953 | * | 12/1997 | Shim | 315/371 |
| 5,977,814 | * | 11/1999 | Ishii | 327/434 |

* cited by examiner

Primary Examiner—Terry D. Cunningham
Assistant Examiner—Quan Tra
(74) Attorney, Agent, or Firm—Anthony Luke Simon

(57) ABSTRACT

A current buffer for a gate driver having an input end and an output end. An independent path electrically couples the above input and output end. The current buffer further includes two switches controlling flows of electrical current via the switches to the output end from a positive and a negative power source respectively. A control circuit controls the switches between an ON and OFF state. When the buffer receives a suitable input signal at the input end, one of the switches is triggered to ON state, the current at the output end are the sum of current that flows from the switch, as well as the current that flows via the independent path. Upon reaching a threshold point, the switch is switched to OFF state. An equilibrium state is reached via the independent path.

4 Claims, 2 Drawing Sheets

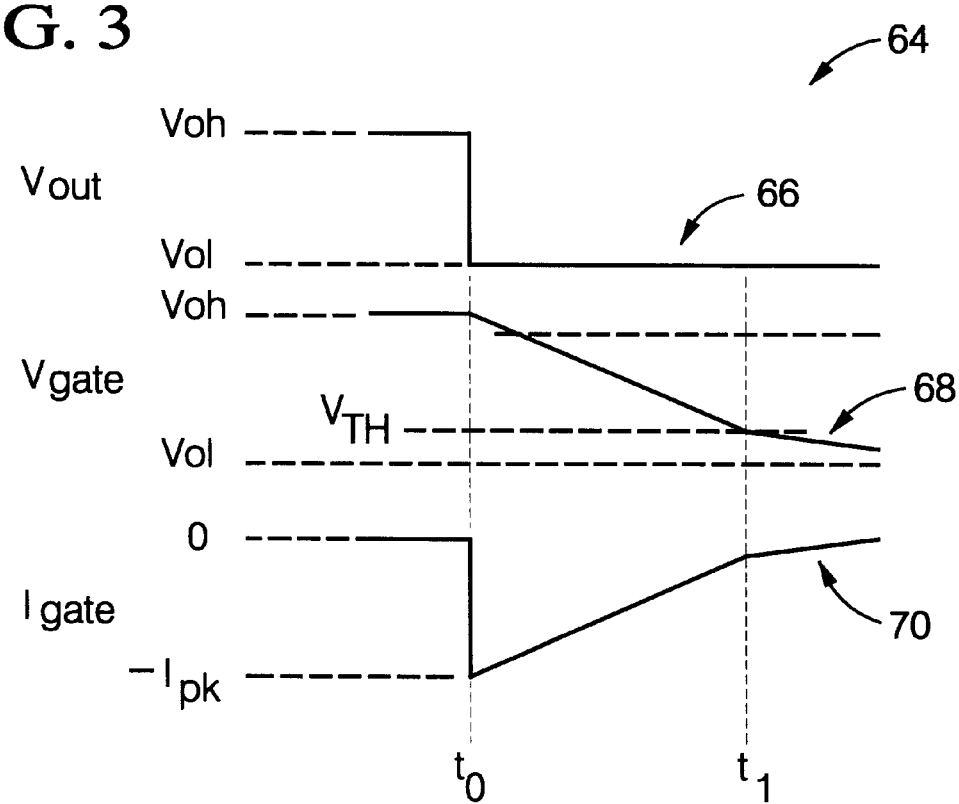

US 6,326,819 B1

CURRENT BUFFER FOR GATE DRIVE

TECHNICAL FIELD

The present invention relates generally to current buffers for driving electronic components and, more particularly, to a current buffer for driving insulated gate bipolar transistors.

BACKGROUND OF THE INVENTION

Switching devices for switching high current to drive high current devices such as an electric motor are well known. Such switch devices include, e.g. Insulated Gate Bipolar Transistors (IGBTs), which are typically controlled by a microprocessor or other digital device to provide desired drive currents to windings of an electric motor. The signals for switching (driving) the IGBTs often require current buffering.

One type of current buffer used to drive an IGBT is a non-inverting bipolar transistor. In other words, the output logic signal of the driver is the same polarity as the output of the current buffer. Additional circuitry (i.e., additional components) is provided to prevent voltage shoot-through as a result of base storage time, as is known. The bipolar transistor also introduces an additional voltage drop (1.4 volts) between the voltage rails and the output, thus requiring a higher voltage bias supply to offset the voltage drop.

Another type of current buffer is a Metal Oxide Silicon Field Effect Transistor (MOSFET), which introduces an inversion of the output of the current buffer. This causes the MOSFETs not to be usable with MOSFET with gate drivers that have built-in fault handling. Additional circuitry is also provided to prevent voltage shoot-through due to mutual conduction of the MOSFETs during the switching time.

SUMMARY OF THE INVENTION

It is therefore an object of the present invention to provide a current buffer arrangement for gate drives that takes advantage of the output drive capability of the gate driver itself. This results in fewer components and thereby reduced manufacturing cost and time. The current buffer is also non-inverting so that it can be used with existing gate drivers with built in fault handling capabilities.

The instant invention advantageously uses the gate driver's current driving capability by defining a path which electrically couples the output of the gate driver (input end of buffer) and the input (output end of buffer) of an electronic device, for example, an IGBT. Two switches each having an ON and OFF state are used. During the ON state a positive or a negative voltage power source supplies power to the output end resulting from the introduction of a suitable signal at the input end of the buffer. A control circuit controls the ON or OFF state of the switches. The control circuit can be a set of suitably arranged resistors. However, the control circuit may include other types of suitable components. When desired input signal occurs at the input end of the buffer, one of the switches is triggered to ON state. The output end of the buffer is charged via the electrical connection through the ON switch as well as current driving capability of the gate driver via the path. Upon reaching a threshold point at the output end of the buffer, e.g. a threshold voltage, the switch is switch to OFF state and the only electrical connection between the input and output end of the buffer is via the path. Thus, the current drive capability of the gate driver (via the path) remains the only source in reaching an equilibrium state between the input and output end of the buffer.

BRIEF DESCRIPTION OF THE DRAWINGS

Referring now to the drawings wherein like elements are numbered alike in the several FIGURES:

FIG. 3 is a graphical representation of the voltage and current waveforms at various nodes of the current buffer of FIG. 1 when the gate driver is de-energized.

DETAILED DESCRIPTION OF THE INVENTION

Figure 1:
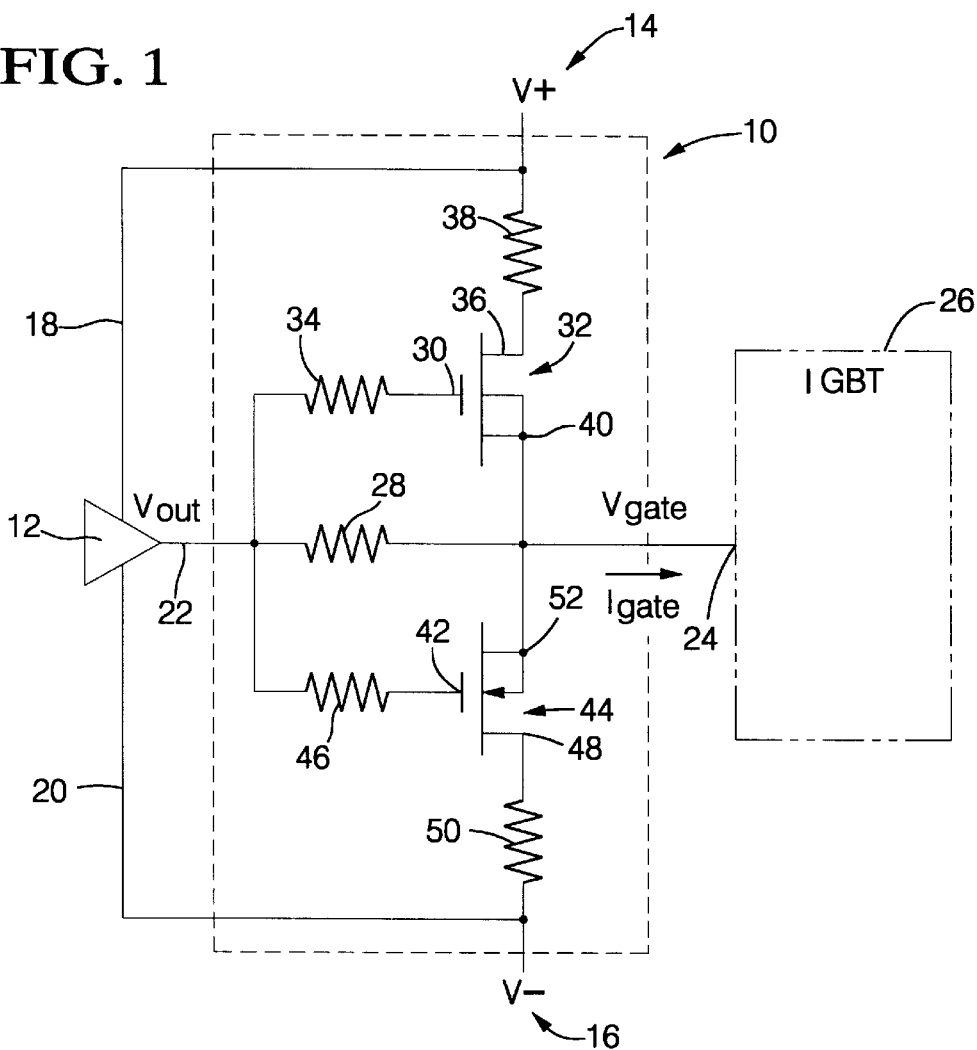
FIG. 1 is a schematic diagram of a current buffer for a gate driver embodying the present invention.

Referring to FIG. 1, a current buffer, generally designated 10, for a gate driver 12, e.g. microprocessor or component providing a digital output signal, is shown. A positive dc voltage source (V+) 14 (e.g., +5 volts and +15 volts) and a complementary negative dc voltage source (V−) 16 (i.e., −5 volts and −15 volts) is provided to the gate driver 12 through leads 18, 20, respectively. The gate driver 12 provides a logic "1" output signal or logic "0" output signal at an output terminal 22. For a logic "1" output, the output voltage (Vout) at the output terminal 22 is approximately equal to the voltage potential of the positive voltage source 14. For a logic "0" output, the output voltage (Vout) at output terminal 22 is approximately equal to the voltage potential of the negative voltage source 16.

The output terminal 22 of the gate driver 12 is connected to a gate 24 of an electronic device 26, e.g. Insulated Bipolar Gate Transistor (IBGT), through a series resistor 28. The output terminal 22 is also connected to a gate 30 of an N-channel MOSFET (metal oxide silicon field effect transistor) 32 through a series resistor 34. A drain 36 of MOSFET 32 is connected to the positive voltage source 14 through a series resistor 38. A source 40 of MOSFET 32 is connected to a gate 24 of the IGBT 26. The output terminal 22 of the gate driver 12 is also connected to a gate 42 of a P-channel MOSFET 44 through a series resistor 46. A drain 48 of MOSFET 44 is connected to the negative voltage source 16 through a series resistor 50. A source 52 of MOSFET 44 is connected to the gate 24 of the IGBT 26.

Figure 2:
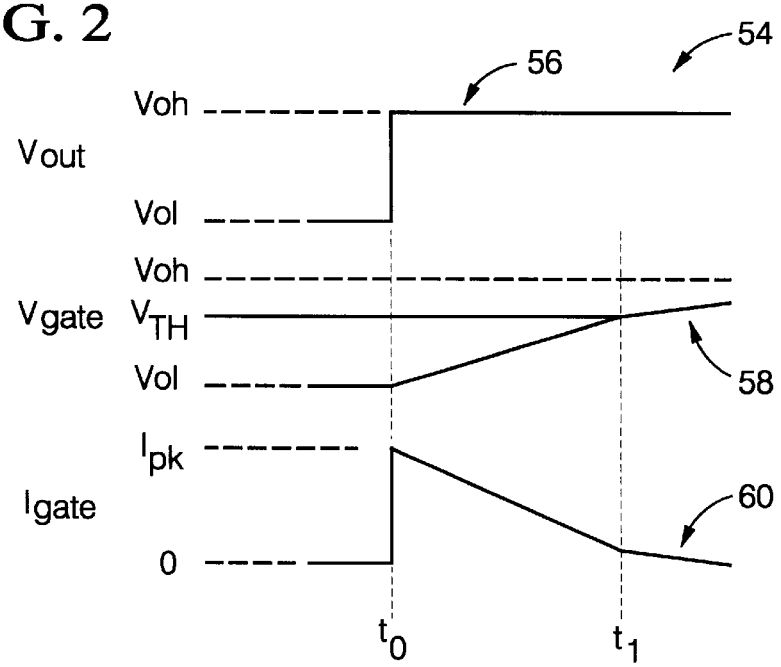
FIG. 2 is a graphical representation of the voltage and current waveforms at various nodes of the current buffer of FIG. 1 when the gate driver is energized.

FIG. 2 illustrates a timing diagram 54 of a voltage waveform 56 representative of the voltage (Vout) at the output terminal 22 of the gate driver 12, a voltage waveform 58 representative of the voltage (Vgate) at the gate 24 of the IGBT 26, and a current waveform 60 representative of the current (Igate) at the gate 24 of the IGBT 26 when the voltage at the output terminal 22 switches from a logic "0" signal to a logic "1" signal. The y-axis for the voltage waveforms 56, 58 are in volts and for the current waveform 60 in amperes. The x-axis is representative of the time in seconds for each of the waveforms 56, 58, 60. Prior to time $t_0$, the output voltage (Vout) of the gate driver 12 is low (Vol) and the input voltage (Vgate) and current (Igate) to the IGBT is low at Vol and zero amps, respectively. At time $t_0$, the output voltage (Vout) of the gate driver 12 switches from a logic "0" (Vol) to a logic "1" (Voh). The gate capacitance of the IGBT 26 initially holds the input voltage (Vgate) of the IGBT 26 at a low initial voltage (Vol). The gate to source voltage (Vout−Vgate) of MOSFET 32 is therefore positive so MOSFET 32 turns on (i.e. MOSFET 32 functions essentially as an electronic switch) to conduct current from the positive voltage source through resistor 38 and MOSFET 32 to charge the IGBT gate capacitance. The IGBT gate capacitance, therefore, charges through the parallel combination of resistor 28 and resistor 38. Consequently, the gate current (Igate) rises to the peak gate current ($I_{pk}$) at $t_0$ wherein:

$$Ipk=(Voh-Vol)/(R_{28} \text{ parallel } R_{38}) \quad (1)$$

The peak gate current ($I_{pk}$) is greater than the output capability of the gate driver 12. The input voltage (Vgate) continues to increase and the input current (Igate) continues to decrease as a function of the parallel resistors 28, 38.

When the input voltage (Vgate) of the IGBT increases to a predetermined threshold voltage ($V_{Th}$) at time $t_1$ such that the gate to source voltage (Vout−Vgate) is less than the threshold voltage ($V_M$) of MOSFET 32, MOSFET 32 turns off and the IGBT gate capacitance continues to charge to output voltage (Voh) of the gate driver 12 only through resistor 28. After time $t_1$, the current drawn from the gate driver 12 is less than $V_M/R_{28}$, which is well within the capability of gate driver 12.

FIG. 3 illustrates a timing diagram 64 of a voltage waveform 66 representative of the voltage (Vout) at the output terminal 22 of the gate driver 12, a voltage waveform 68 representative of the voltage (Vgate) at the gate 24 of the IGBT 26, and a current waveform 70 representative of the current (Igate) at the gate 24 of the IGBT 26 when the voltage at the output terminal 22 switches from a logic "1" signal to a logic "0" signal. The y-axis for the voltage waveforms 66, 68 is in volts and for the current waveform 70 in amperes. The x-axis is representative of the time in seconds for each of the waveforms 66, 68, 70. Prior to time $t_0$, the output voltage (Vout) of the gate driver 12 and the input voltage (Vgate) of the IGBT 26 are high (Voh) and the current (Igate) to the IGBT is at zero amps. At time $t_0$, the output voltage (Vout) of the gate driver 12 switches from a logic "1" (Voh) to a logic "0" (Vol). The gate capacitance of the IGBT 26 initially holds the input voltage (Vgate) of the IGBT 26 at a high initial voltage (Voh). The gate to source voltage (Vout−Vgate) of MOSFET 44 is therefore negative so MOSFET 44 turns on (i.e., MOSFET 44 functions essentially as an electronic switch) to conduct current from the negative voltage source 16 through resistor 50 and MOSFET 44 to charge the IGBT gate capacitance. The IGBT gate capacitance, therefore, charges through the parallel combination of resistor 28 and resistor 50. Consequently, the gate current (Igate) falls to the negative peak gate current ($-I_{pk}$) at $t_0$ wherein:

$$Ipk=(Vol-Voh)/(R_{28} \text{ parallel } R_{48}) \quad (2)$$

The negative peak gate current ($-I_{pk}$) is greater than the output capability of the gate driver 12. The input voltage (Vgate) continues to decrease and the input current (Igate) continues to increase as a function of the parallel resistors 28, 48.

When the input voltage (Vgate) of the IGBT decreases to a predetermined negative threshold voltage ($-V_{Th}$) at time $t_1$, such that the gate to source voltage (Vout−Vgate) is greater than the threshold voltage ($V_M$) of MOSFET 44, MOSFET 44 turns off and the IGBT gate capacitance continues to discharge to output voltage (Vol) of the gate driver 12 only through resistor 28. After time $t_1$ the current drawn from the gate driver 12 is less than $V_M/R_{28}$, which is well within the capability of gate driver 12.

This current buffer uses fewer, smaller, and cheaper parts than competing buffers this providing significant manufacturing cost and time savings. This also in turn requires less circuit board space resulting in a more compact product.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A circuit comprising a current buffer for a gate driver for driving an insulated gate bipolar transistor, wherein the insulated gate bipolar transistor has equilibrium states including an ON state and an OFF state and wherein the insulated gate bipolar transistor transitions between the equilibrium states; said current buffer comprising:

a resistive path electrically coupling the gate driver to a gate of the insulated gate bipolar transistor, wherein a first equilibrium current maintaining the insulated gate bipolar transistor in the ON state and a second equilibrium current maintaining the insulated gate bipolar transistor in the OFF state flow solely through the resistive path;

first and second switching devices, wherein the first switching device is coupled between a first voltage potential and the gate of the insulated gate bipolar transistor, wherein the second switching device is coupled between a second voltage potential and the gate of the insulated gate bipolar transistor, wherein control inputs of the first and second switching devices are coupled to the gate driver, wherein when a signal from the gate driver commands transition of the insulated gate bipolar transistor from one of the equilibrium states to the other, one of the first and second switching devices switches on to provide a transition current to the insulated gate bipolar transistor during the transition and switches off after the transition in response to a voltage of the gate fed back to the first and second switching devices, wherein the first and second switching devices are switched off when the insulated gate bipolar transistor is in the ON state and when the insulated gate bipolar transistor is in the OFF state.

2. The current buffer of claim 1, wherein each of the first and second switching devices comprises a MOSFET.

3. The current buffer of claim 1, wherein the first switching device comprises a N-channel MOSFET, and the second switching device comprises a P-channel MOSFET.

4. A circuit comprising a current buffer for driving an insulated gate bipolar transistor; said circuit buffer:

a gate driver having an output lead, the gate driver providing first and second output voltages at the output lead;

a first switching device with a first control input coupled to the gate driver and coupled to a gate of the insulated gate bipolar transistor, wherein the first switching device couples a first current from a positive voltage source to the gate in response to the first output voltage during a first transition of a gate voltage of the gate to an on voltage and then terminates the first current after the first transition of the gate voltage to the on voltage;

a second switching device with a second control input coupled to the gate driver and coupled to the gate, wherein the second switching device couples second current from a negative voltage source to the gate in response to the second output voltage during a second transition of the gate voltage of the gate to an off voltage and then terminates the second current after the second transition of the gate voltage to the off voltage;

a resistor electrically connected between the output lead of the gate driver and the input of the insulated gate bipolar transistor, wherein the resistor provides a first equilibrium current necessary to maintain the gate voltage in the on state after the first transition and a second equilibrium current necessary to maintain the gate voltage in the off state after the second transition, wherein the first and second switching devices are switched off when the gate voltage is in the on state and when the gate voltage is in the off state.

* * * * *